(12) United States Patent
Bungo et al.

(10) Patent No.: US 7,167,967 B2
(45) Date of Patent: Jan. 23, 2007

(54) MEMORY MODULE AND MEMORY-ASSIST MODULE

(75) Inventors: Motohiko Bungo, Aichi-ken (JP); Kaoru Yuasa, Aichi-ken (JP)

(73) Assignee: Buffalo Inc., Nagoya (JP)

( * ) Notice: Subject to any disclaimer, the term of this patent is extended or adjusted under 35 U.S.C. 154(b) by 241 days.

(21) Appl. No.: 10/719,316

(22) Filed: Nov. 20, 2003

(65) Prior Publication Data

US 2005/0114622 A1    May 26, 2005

(51) Int. Cl.
  *G06F 12/00*  (2006.01)
  *G11C 5/00*   (2006.01)
  *G11C 5/06*   (2006.01)
  *G11C 7/00*   (2006.01)

(52) U.S. Cl. ............... 711/200; 711/5; 711/100; 711/212; 365/52; 365/63; 365/191

(58) Field of Classification Search ........ 711/200, 711/212, 5, 100; 365/191, 52, 63
See application file for complete search history.

(56) References Cited

U.S. PATENT DOCUMENTS

| | | | |
|---|---|---|---|
| 4,831,522 A | | 5/1989 | Henderson et al. |
| 5,255,382 A | * | 10/1993 | Pawloski ................ 711/2 |
| 5,594,704 A | | 1/1997 | Konishi et al. |
| 5,802,601 A | | 9/1998 | Kania et al. |
| 5,953,280 A | | 9/1999 | Matsui |
| 6,788,592 B2 | * | 9/2004 | Nakata et al. ............. 365/191 |
| 2003/0090879 A1 | | 5/2003 | Doblar et al. |

FOREIGN PATENT DOCUMENTS

| | | |
|---|---|---|
| JP | 61-134982 | 6/1986 |
| JP | 08-314806 | 11/1996 |
| JP | 09-231747 | 9/1997 |

OTHER PUBLICATIONS

Communication dated Jun. 15, 2004 including European Search Report dated Jun. 7, 2004 (total 3 pages).
Office action, JP app.2002-257773,mailed Jan. 13, 2005, (corresponding app).
Tadashi Okada, Basic Characteristics of Memory IC, Memory IC Utilization Handbook, Aug. 10, 1991, CQ Publishing Office, Japan.

* cited by examiner

*Primary Examiner*—Reginald Bragdon
*Assistant Examiner*—Mehdi Namazi
(74) *Attorney, Agent, or Firm*—Peter Ganjian

(57) ABSTRACT

A computer body outputting a predetermined number of address signals A0 to A11 and a plurality of select signals CS0 and CSI, generates a memory select signal CS and an additional address signal A12 added to the signals A0 to A11 according to the inputted signals CS0 and CSI, and provides the signal CS, signal A12, and signals A0 to A11 to a 256-megabit SDRAM (memory), so that the computer body can access the corresponding data. The computer body can access the data corresponding to the generated additional address signal A12 and predetermined number of the address signals A0 to A11.

8 Claims, 12 Drawing Sheets signals which can be directly inputted from a PC outputting address signals A0 to A11 when an additional address signal is inputted into A11 terminal

FIG. 12

| CS0 | CS1 | CS2 | CS3 | A13 | A12 |
|-----|-----|-----|-----|-----|-----|
| L | H | H | H | 1 | 1 |
| H | L | H | H | 1 | 0 |
| H | H | L | H | 0 | 1 |
| H | H | H | L | 0 | 0 |

MEMORY MODULE AND MEMORY-ASSIST MODULE

BACKGROUND OF THE INVENTION

1. Field of the Invention

The present invention relates to a memory module and memory-assist module connectable to a computer body.

2. Description of the Prior Art

Conventionally, memory expansion has been implemented by connecting memory modules to sockets (slots) of a computer body. As the memory modules, a 128-megabyte DIMM (Dual Inline Memory Module) having eight 128-megabit SDRAMs (Synchronous Dynamic Random Access Memories), a 128-megabyte DIMM (Dual Inline Memory Module) having sixteen 256-megabit SDRAMs (Synchronous Dynamic Random Access Memories), and the like are used. Generally, twelve address signal terminals A0 to A11 are provided to the 128-megabit SDRAM, to which twelve signal lines of a row address and ten signal lines of a column address can be connected. When address signals A0 to A11 are inputted from the computer body, data of an address corresponding to the address signals can be read/written from/on the whole 128-megabit areas of all the SDRAMs.

The 256-megabyte DIMM is divided into two groups (banks) of the SDRAMS. In addition to the address signals A0 to A11, a plurality of chip select signals corresponding to the banks to be accessed are inputted, so that data of the corresponding bank and address can be read/written from/on the whole of 256-megabyte area of the DIMM. As just described, by using a plurality of the chip select signals for selecting the banks, a memory capacity available for the computer body can be expanded.

A module where memories to be accessed are switched according to a state of the most significant address signal inputted from a computer body, a technique of which module is disclosed in the gazette of Japanese Patent No.3022255 (paragraphs 0014 to 0054, FIGS. 1 to 8), is also known.

In the above-described technique, there was the following problem.

Recently, 256-megabyte DIMMs each having eight 256-megabit SDRAMs have been used. However, to access the whole memory area of the 256-megabit SDRAM, row address signals A0 to A12 need to be inputted into the SDRAM. As a result, such old computer bodies that output only address signals A0 to A11 could use only the area of 128 megabits, which was half of the 256-megabit SDRAM. Also with the module of Japanese Patent No.3022255, memories to be accessed are only switched according to the most significant address signal A11, so that this module had the same problem.

SUMMARY OF THE INVENTION

The present invention is achieved for solving the above-described problem. An object of the present invention is to provide a memory module and memory-assist module for permitting a computer body to access a memory area which cannot be accessed using only a predetermined number of address signals inputted from the computer body so that the memory area is effectively used.

To achieve the object, the memory module of the present invention comprises a memory and a memory circuit. The memory module is standardized and connectable to a computer body which generates a predetermined number of address signals and a plurality of select signals representing a selected or unselected state of a plurality of memory spaces having a capacity corresponding to the address signals. In the memory, by inputting a memory select signal representing a selected or unselected state and a plurality of address signals greater than the predetermined number of the address signals, data corresponding to a plurality of the address signals can be accessed when the memory select signal represents a selected state. In the memory circuit, the following procedure is done. The predetermined number of the address signals and a plurality of the select signals are inputted from the computer body. The memory select signal and an address signal added to the predetermined number of the address signals are generated according to the inputted select signals. The generated memory select signal, the generated added address signal, and the predetermined number of the inputted address signals are provided to the memory so that the corresponding data can be accessed from the computer body.

The standardized memory module is connected to the computer body, which can access the memories. The computer body inputs into the memory circuit a predetermined number of address signals and a plurality of select signals representing a select or unselected state of each of a plurality of memory spaces having a capacity corresponding to the predetermined number of the address signals. In the memories of the memory module, a memory select signal representing a selected or unselected state and a plurality of address signals greater than the predetermined number of the address signals are inputted, and when the memory select signal represents a selected state, data corresponding to the plurality of the address signals is accessible.

The memory select signal is generated in the memory circuit according to the select signal. Also the additional address signal added to the predetermined number of the address signals is generated in the memory circuit according to the select signal. The generated memory select signal is provided to the memory, so that the memory is accessible when the memory select signal represents a selected state. The generated additional address signal and the inputted predetermined number of the address signals are provided to the memory, so that the computer body can access data corresponding to the generated additional address signal and the inputted predetermined number of the address signals.

In other words, an address signal other than a predetermined number of address signals inputted from a computer body is generated according to a select signal, so that the computer body can access a memory area which is not accessible using only the predetermined number of the address signals. For example, even when the computer body outputs address signals with which the whole memory area of only a DRAM of under 128 megabits is accessible, it can access a memory area of over 128 megabits in a DRAM of over 256 megabits. The present invention is applicable to memories having various capacities.

Additionally, by generating a memory select signal, the number of memories accessible by a computer body can be increased, so that a memory capacity accessible by the computer body can be expanded.

The number of the memories may be one or more. The memory may be such that both write and read of data, or either of them is possible. Even in this case, the memory is accessible using the present invention. Therefore, the present invention is applicable to various memories such as SDRAMs and ROMs.

It is preferable that, by adding an additional address to the predetermined number of the address signals, the whole memory area is accessible, so that the memory capacity can be used effectively. The whole memory areas do not need to be accessible because the additional address may be added to the predetermined number of the address signals. In this case, by providing the additional address to the memory, a memory area larger than a memory space corresponding to the predetermined number of the address signals is accessible.

As described above, according to the present invention, a computer body can access a memory area which is not accessible with only the predetermined number of the address signals inputted from the computer body, so that the memory area can be effectively used.

Various configurations where the memory select signal is generated are possible. As one example, in the memory circuit, when either of the plurality of the inputted select signals may represent a selected state of the memory space, the memory select signal represents a selected state of the memory, and when all the plurality of the inputted select signals represent an unselected state of the memory spaces, the memory select signal may represent an unselected state of the memory.

In other words, when a plurality of select signal selects either of a plurality of memory spaces, a memory select signal selects a memory, and when a plurality of select signal selects no memory space, the memory select signal does not select the memory.

For example, when the selected state is represented by LOW of a select signal and memory select signal, and the unselected state is represented by HIGH of a select signal and memory select signal, a plurality of select signals are inputted into an AND gate, from which the memory select signal can be outputted. When the selected state is represented by HIGH of a select signal and memory select signal, and the unselected state is represented by LOW of a select signal and memory select signal, a plurality of select signals are inputted into an OR gate, from which the memory select signal can be outputted. When a select signal and memory select signal represent different states, the memory select signal can be generated by using, e.g., a NAND gate and NOR gate.

In such a manner, as one example, a memory select signal can be properly generated.

When the computer body generates two types of select signals each representing a selected or unselected state of each of two memory spaces having a capacity corresponding to the predetermined number of the address signals, the memory circuit may receive either of the two types of the select signals, and provide it to the memory as the additional address signal. In other words, with a simple configuration, either of two types of select signals becomes an additional address signal, which is provided to a memory.

When more than three types of select signals are generated, an additional address signal can be generated from a plurality of select signals.

In such a manner, with a simple configuration, an additional address signal can be generated.

Some computer bodies output a signal for sleeping memories of an unused bank to save the power. To do this, the following configuration may be used. The memory receives a pulse-shaped clock signal and a memory clock enable signal representing a valid or invalid state of an input of the clock signal, and can operate according to the clock signal when the clock enable signal represents a valid state. The computer body generates the clock signal and a plurality of clock enable signals representing a valid or invalid state of the clock signal input for each of the plurality of the memory spaces. The memory circuit receives the clock signal and the plurality of the clock enable signals from the computer body, generates the memory clock enable signal according to the plurality of the inputted clock enable signals, and provides the memory clock enable signal and the inputted clock signal to the memory.

In other words, a pulse-shaped clock signal and a plurality of clock enable signals representing a valid or invalid state of a clock signal input for each of a plurality of memory spaces are inputted from the computer body to memory circuit. The memory receives a clock signal and a memory clock enable signal representing a valid or invalid state of an input of the clock signal, and operates according to the clock signal when the clock enable signal represents a valid state.

The memory clock enable signal is generated in the memory circuit according to the plurality of the clock enable signals. The generated memory clock enable signal and the clock signal are provided to the memory, so that the memory becomes operable when the memory clock enable signal represents the valid state.

As described above, when the computer body outputs a plurality of clock enable signals to a plurality of memory spaces, the memory is properly accessible.

Various configurations for generating the memory clock enable signal are possible. As one example, in the memory circuit, when either of the plurality of the inputted clock enable signals represents a valid state of the clock signal input for the memory space, the memory clock enable signal represents a valid state of the clock signal input for the memory, and when all of the plurality of the inputted clock enable signals represent an invalid state of the clock signal input for the memory space, the memory clock enable signal represents an invalid state of the clock signal input for the memory.

In other words, when a plurality of clock enable signals represent a valid state of a clock signal input for either of a plurality of memory spaces, a memory clock enable signal represents a valid state of a clock signal input for a memory, and when a plurality of clock enable signals represent an invalid state of clock signal inputs for all of a plurality of memory spaces, a memory clock enable signal represents an invalid state of a clock signal input for a memory. As well as the memory select signal, the memory clock enable signal can be generated using an OR gate, AND gate, NOR gate, NAND gate, and so on.

In such a manner, as one example, the memory clock enable signal can be properly generated.

The additional address signal may be one which can represent an address upper than an address represented by the predetermined number of the address signals. In other words, an additional address signal upper than the predetermined number of the address signals is generated and provided, accompanying the predetermined number of the address signals, to the memory.

The additional address signal may be the most significant address signal of the predetermined number of the address signals.

In such a manner, the additional address signal can be easily generated.

Without providing the memory select signal to the memory, by generating an additional address signal from the select signal, the computer body can access a memory area which cannot be accessed using only a predetermined number of address signals.

In other words, a predetermined number of address signals and a select signal representing a selected or unselected state of a plurality of memory spaces of a capacity corresponding to the predetermined number of the address signals are inputted from the computer body into memory circuit. The memory provided on the memory module receives a plurality of address signals greater than the predetermined number of the address signals to permit data corresponding to the plurality of the address signals to be accessible.

The additional address signal added to the predetermined number of the address signals is generated in the memory circuit according to the select signal. The generated address signal and the inputted predetermined number of the address signals are provided to the memory, so that the computer body can access data corresponding to the generated address signal and the predetermined number of the address signals.

In other words, a computer body can access a memory area which is not accessible using only a predetermined number of address signals inputted from the computer body because an address signal other than the predetermined number of the address signals is generated according to the select signal.

By mounting a memory on a memory module having no memory, a computer body can access a memory area which is not accessible using a predetermined number of address signals. The following configuration may be possible. A memory is connected to a computer body which generates a predetermined number of address signals and a plurality of select signals representing a selected or unselected state of each of a plurality of memory spaces having a capacity corresponding to the predetermined number of the address signals. The memory receives a memory select signal representing a selected or unselected state and a plurality of address signals greater than the predetermined number of the address signals, so that data corresponding to the plurality of the address signals becomes accessible by the computer body when the memory select signal represents a selected state. The predetermined number of the address signals and the plurality of the select signals are inputted from the computer body, and the memory select signal and an additional address added to the predetermined number of the address signals are generated according to the inputted select signals. The generated memory select signal, the generated additional address signal, and the inputted predetermined number of the address signals are provided to the memory. As a result, the computer body can access the corresponding data.

Also the following configuration is possible. A memory is connected to a computer body which generates a predetermined number of address signals and a select signal representing a selected or unselected state of each of a plurality of memory spaces having a capacity corresponding to the predetermined number of the address signals. The memory receives a plurality of address signals greater than the predetermined number of the address signals so that the corresponding data becomes accessible by the computer body. The predetermined number of the address signals and the select signal are inputted from the computer body, and an additional address added to the predetermined number of the address signals are generated according to the inputted select signal. The additional address signal and the inputted predetermined number of the address signals are provided to the memory. As a result, the computer body can access the corresponding data.

In other words, the present invention is applicable to a memory-assist module having no memory. The above-described various configurations are applicable to the memory-assist module.

BRIEF DESCRIPTION OF THE DRAWINGS

FIG. 12 is a table showing relationship between states of signals CS0 to CS3 and signals A12 and A13.

DESCRIPTION OF THE PREFERRED EMBODIMENTS

Embodiments of the present invention is explained in the following order.

Figure 1:
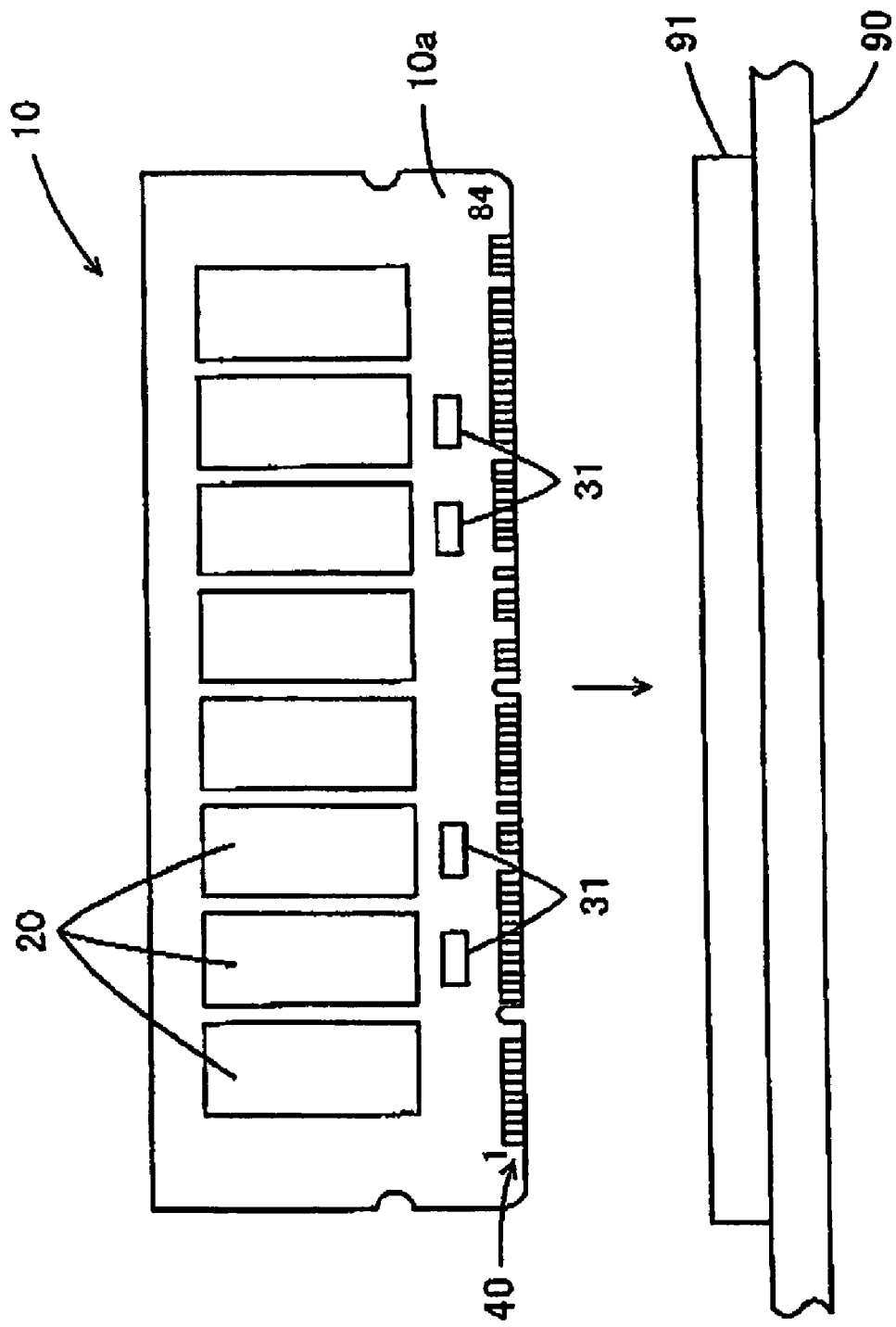
FIG. 1 is a front view showing an appearance of a memory module of one embodiment of the present invention.

(1) Structure of a memory module
(2) Effect of the memory module
(3) Alternatives
(1) Structure of a Memory Module FIG. 1 is a front view showing an appearance of a memory module 10 of an embodiment of the present invention. The positional relationship of up, down, left, and right is explained according to FIG. 1.

Eight 256-megabit SDRAMs 20, a plurality of gate ICs 31, a resistor circuit (not shown), and the like are mounted on a print board 10a of the memory module 10. The print board 10a has a standardized shape. A 168-pin DIMM terminal 40 is formed on the bottom edge of the print board 10a. Each of front and back surfaces of the bottom edge has 84 pins. The memory module 10 is an expansion memory card for desktop type personal computers (PCs), and can be inserted to a connector (slot) 91 of a mother board 90 of a desktop type PC (computer body). Corresponding to location of the terminal 40, 168 conductive portions are formed on the connector 91. The connector 91 has a shape into which a standardized 168-pin DIMM can be inserted. The memory module 10 is inserted from above into the connector 91, so that it can be installed almost vertically on the motherboard, and connected to the desktop type PC. As a result, memory of the desktop type computer can be expanded.

The desktop type PC connected to the memory module 10 is not the newest model, and uses a memory capacity of 256-megabytes as two banks each having 128 megabytes.

Thus, the PC has a configuration preferable for adding, for example, a 256-megabyte DIMM having sixteen 128-megabit SDRAMs.

Figure 2:
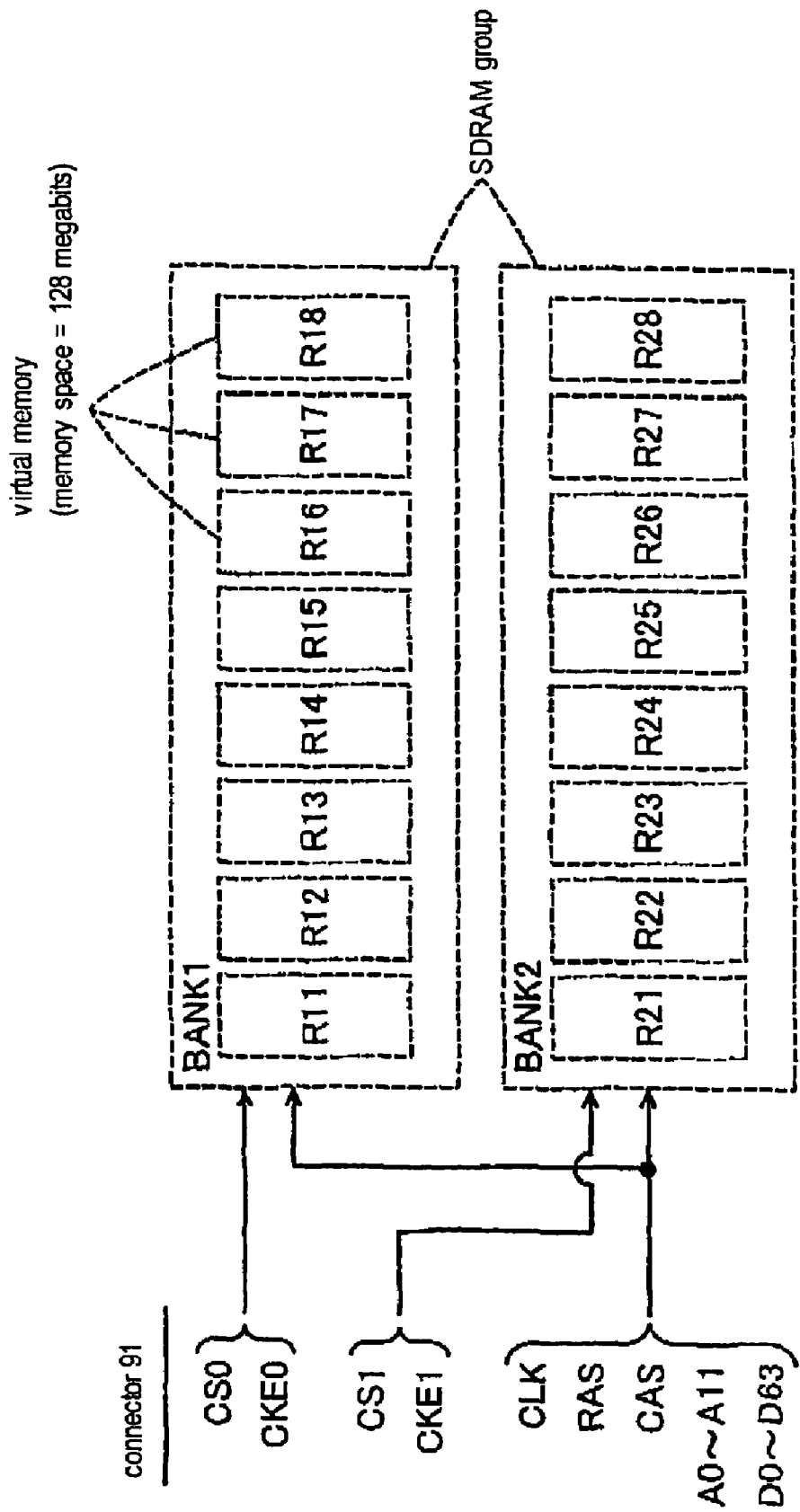
FIG. 2 shows apart of wiring relationship between a connector of a desktop type PC and a conventional 128-megabit SDRAM.

FIG. 2 shows a part of wiring relationship between the connector 91 of the desktop type PC and virtual memory spaces formed using a conventional 256-megabyte DIMM having sixteen 128-megabit SDRAMs.

In FIG. 2, 128-megabit virtual memories R11 to R18, and R21 to R28 are formed as two blocks (banks) each having eight SDRAMs. The group of the SDRAMs of the upper side of FIG. 2 is called a bank 1, and the group of the lower side is called a bank 2. Connection portions for various types of signal lines CLK, RAS, CAS, A0 to A11, D0 to D63, CS0, CS1, CKE1, CKE2, and the like are formed on the connector 91.

A CLK signal means a clock signal. The PC generates a pulse-shaped clock signal of a predetermined frequency and provides it to the signal line CLK.

The RAS (Row Address Strobe) signal means a signal sending timing of giving a row address to a SDRAM. The CAS (Column Address Strobe) signal means a signal sending timing of giving a column address to a SDRAM. The signals A0 to A11 mean a predetermined number (twelve types) of address signals, the signals specifying an address in a memory space. In a DIMM having 128-megabit SDRAMs to/from which 8-bit data can be inputted/outputted, twelve types of address signals for a row address and ten types of address signals for a column address are provided to the SDRAMs. The PC generates the signals RAS, CAS, and A0 to A11, and provided them to the signal lines according to the SLK signal.

The signals D0 to D63 mean sixty-four types of data signals. Sixty-four data signal lines are divided into eight groups each having eight signal lines. The group of eight signal lines are connected to each of the SDRAMs.

The signals CS0 and CS1 are chip select signals (select signals) for selecting the group of the SDRAM. The select signals represent a selected or unselected state of each of the groups of the SDRAMs. The select signals are negative logic signals which represent L (LOW) for the selected state or H (HIGH) for the unselected state. The signals CS0 and CS1 are not switched to L simultaneously. Either of the signals becomes L when accessing the SDRAM.

The signals CKE1 and CKE2 are clock enable signals representing a valid or invalid state of a CLK signal input for each of the two groups of the SDRAMs. The signals are positive logic signals representing a valid state as H or an invalid state as L. The PC generates the signals CS0, CS1, CKE1, and CKE2, and provides them to the signal lines according to the CLK signal.

Additionally, signal lines for two types of extended address signals BA0 and BA1, a power supply line, and the like are formed on the connector 91.

The signals CLK, RAS, CAS, A0 to A11, and D0 to D63 are provided to the banks 1 and 2. The signals CS0 and CKE0 are provided to the bank 1. The signals CS1 and CKE1 are provided to the bank 2.

Figure 3:
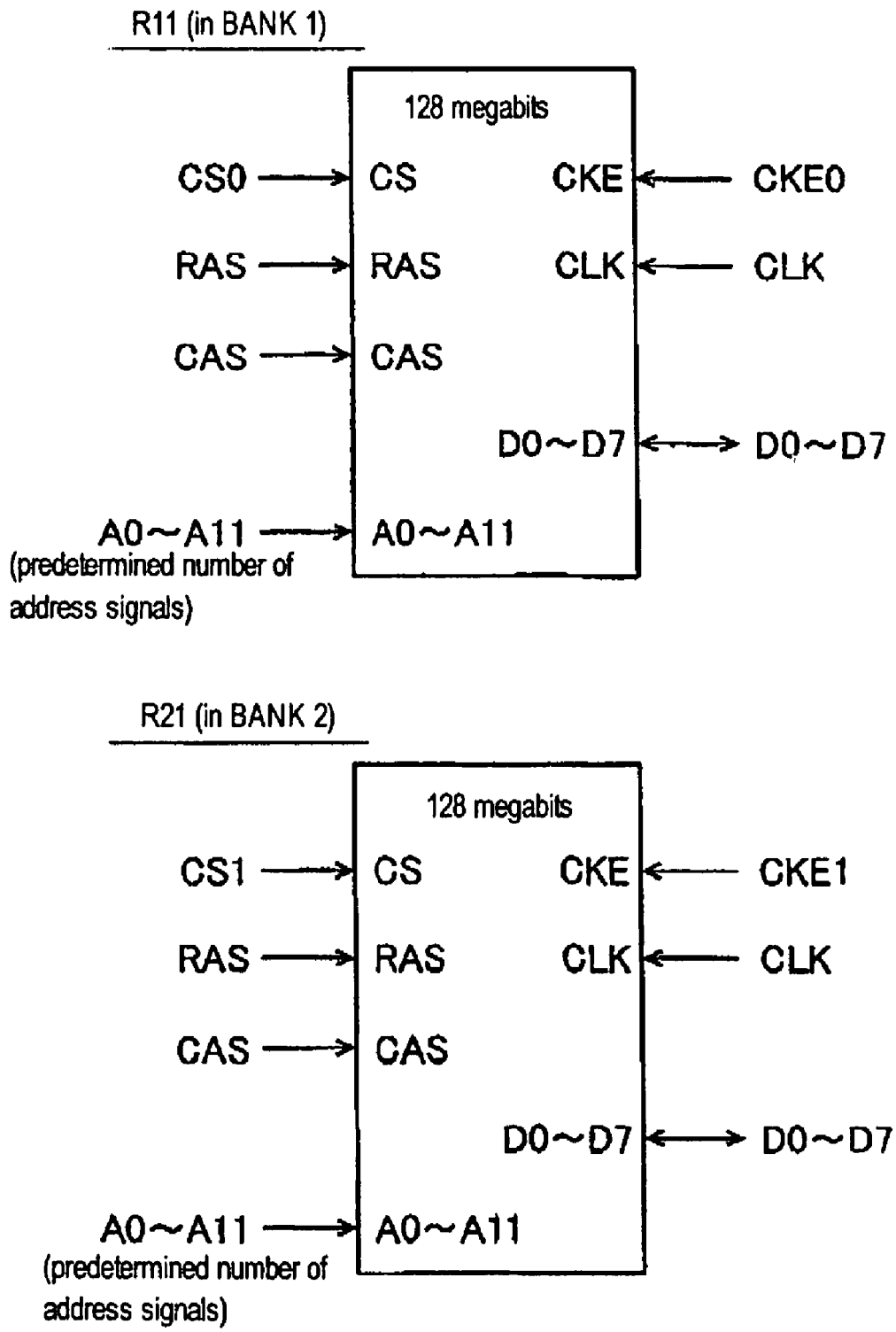
FIG. 3 shows a main part of terminals of a conventional 128-megabit SDRAM in each group of SDRAMs and signal lines connected to the terminals.

FIG. 3 shows main parts of terminals of conventional 128-megabit SDRAMs corresponding to virtual memories in the groups of the SDRAMs and the signal lines connected to the terminals. In FIG. 3, names of the terminals are described within the SDRAMs, and names of the signal lines are described outside the SDRAMs.

The SDRAM is a memory where data corresponding to the signals A0 to A11 can be accessed when a select signal, which represents L (selected state), and the signals A0 to A11 are inputted. The SDRAM can operate according to the CLK signal when a clock enable signal is inputted into the CKE terminal and represents H (valid state).

The signal lines CLK, RAS, CAS, A0 to A11, and D0 to D7 are connected to the clock signal input terminal CLK, row address signal input terminal RAS, column address signal input terminal CAS, address signal input terminals A0 to A11, and data signal input/output terminals D0 to D7 of the virtual memory R11 in the bank 1, respectively. The corresponding data are inputted/outputted to/from these terminals. The data signal input/output terminals D0 to D7 of each of the virtual memories R12 to R18 in the bank 1 are connected to a different group of eight data signal lines. The signal lines CS0 and CKE0 are connected to the chip select signal input terminal CS and the clock enable signal input terminal CKE. The chip select signal representing a selected or unselected state of the bank 1 is inputted into the CS terminal. The clock enable signal representing a valid or invalid state of a clock signal input for the bank 1 is inputted into the CKE terminal. The virtual memories R12 to R18 are connected to the same signal lines CS0 and CKE0 as the virtual memory R11.

On the other hand, the same signal lines as the virtual memory R11 are connected to terminals CLK, RAS, CAS, A0 to A11, and D0 to D7 of the virtual memory R21 in the bank 2. The signal lines CS1 and CKE1 are connected to the terminals CS and CKE, respectively. The chip select signal representing a selected or unselected state of the bank 2 is inputted into the CS terminal. The clock enable signal representing a valid or invalid state of a clock signal input for the bank 2 is inputted into the CKE terminal. The same signal lines CS1 and CKE as R21 are connected to the virtual memories R22 to R28.

The 128-megabit SDRAM is provided with, e.g., terminals BA0 and BA1 to which an extended address signal can be inputted. A row address of 12 bits, a column address of 10 bits, and an extended address of 2 bits, the sum of which is 24 bits, are inputted and 8-bit data corresponding to the address are inputted/outputted, so that the SDRAM has a 128-megabit ($2^{24}*8$ bits) memory space.

Figure 4:
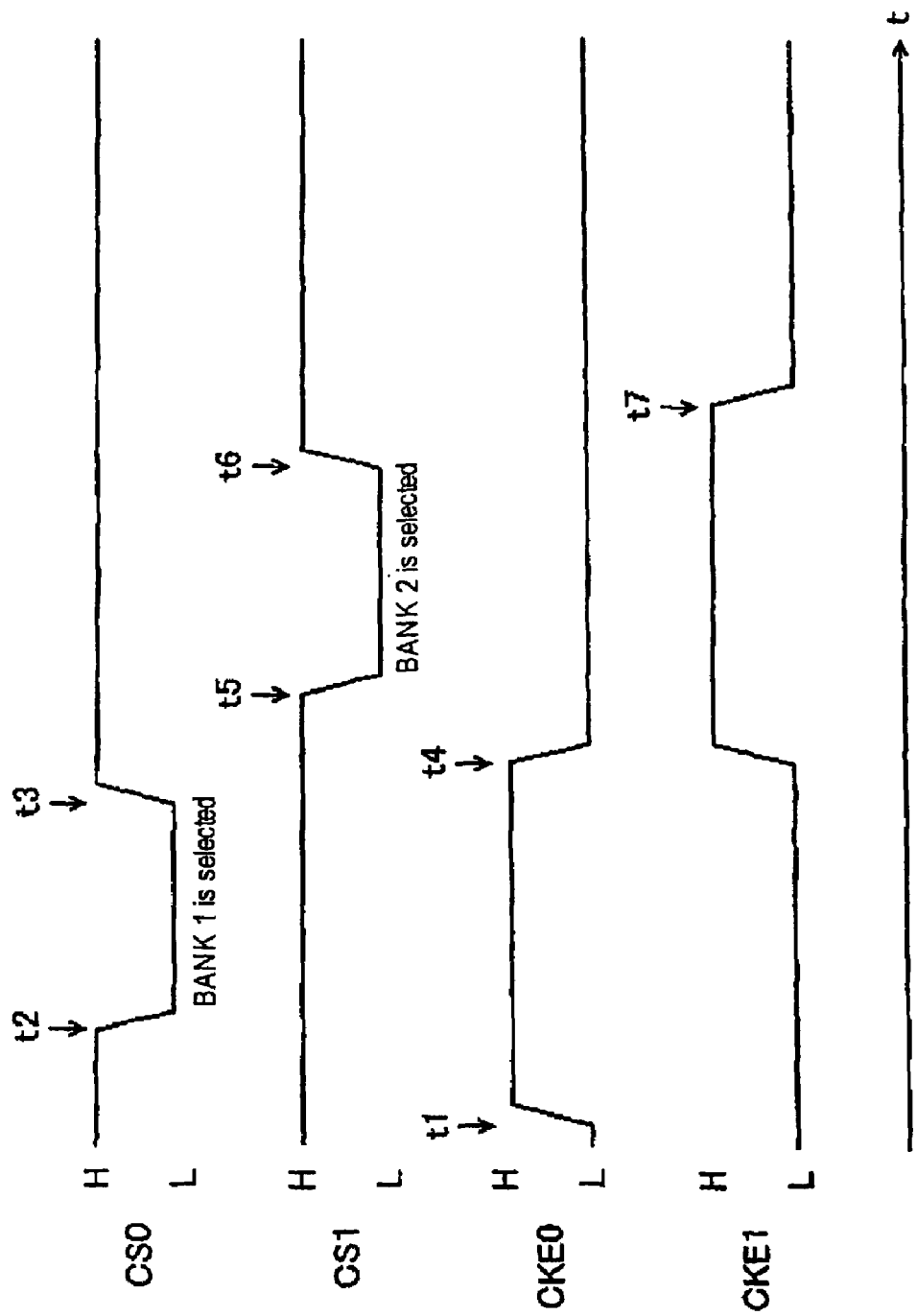
FIG. 4 is a timing chart showing a signal outputted from a connector of a desktop type PC.

FIG. 4 is a timing chart of states of signals outputted from the connector 91 of the desktop type PC.

To save the power, the desktop type PC outputs a clock enable signal to sleep memories of the unused bank. To access the SDRAMs of the bank 1, the signal CKE0 is switched from L to H (timing t1) to cancel a sleep state of the SDRAMs. To access the SDRAMs of the bank 1, the signal CS0 is switched from H to L (timing t2). To end the access to the SDRAMs of the bank 1, the signal CS0 is switched from L to H (timing t3). To sleep the SDRAMs of the bank 1, the signal CKE0 is switched from H to L. To access the SDRAMs of the bank 2, the signal CKE1 is switched from L to H (timing t4) to cancel a sleep state of the SDRAMs of the bank 2. To access the SDRAM of the bank 2, the signal CS1 is switched from H to L (timing t5). To end the access to the SDRAM of the bank 2, the signal CS1 is switched from L to H (timing t6). To sleep the SDRAMs of the banks 1 and 2, the signals CKE0 and CKE1 are switched to L.

As described above, the desktop type PC generates two select signals for two memory spaces having a capacity (128 megabits*8) corresponding to a predetermined number of address signals so that the signals CS0 and CS1 are not switched to L simultaneously. Additionally, the desktop type PC generates two clock enable signals for the two memory spaces so that the signals CKE0 and CKE1 are not switched to H simultaneously.

Figure 5:
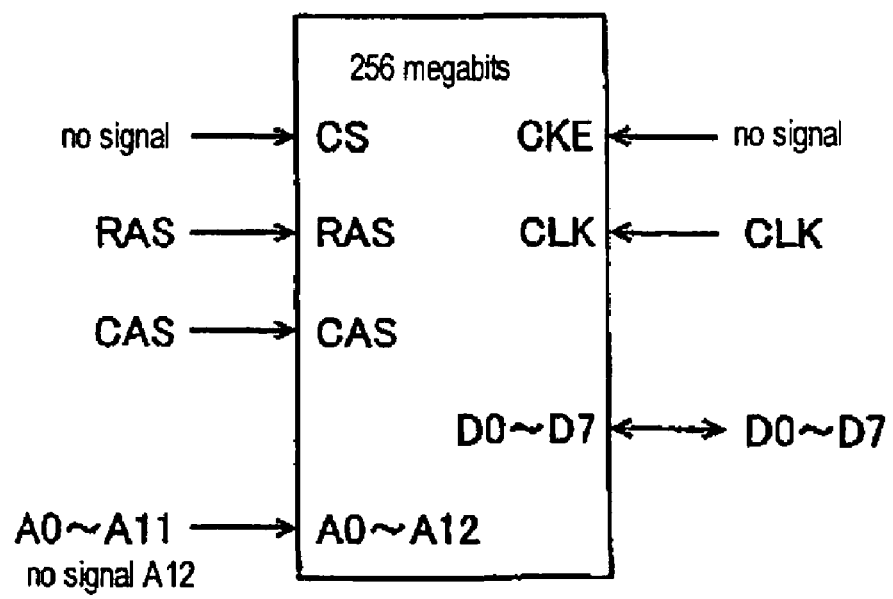
FIG. 5 shows a main part of terminals of a 256-megabit SDRAM and signal lines connectable to the terminals when the desktop type PC is used.

Recently, 256-megabyte DIMMs each having eight 256-megabit SDRAMs have been used. FIG. 5 shows a main part of terminals of a 256-megabit SDRAM and signal lines connectable to the terminals when the desktop type PC is used.

The 256-megabit SDRAM is a memory where a memory select signal and a plurality of address signals A0 to A12 greater than a predetermined number of address signals A0 to A11 are inputted and data corresponding to the address signals A0 to A12 can be accessed when the memory select signal represents L (selected state). When a memory clock enable signal is inputted into the terminal CKE and the memory clock enable signal represents H (valid state), the 256-megabit SDRAM is operable according to a signal CLK.

As shown in FIG. 5, since there are signals corresponding to terminals CLK, RAS, CAS, and D0 to D7, the signals can be directly inputted into the terminals. However, since there is no signal corresponding to an address signal input terminal A12, only an area of 128 megabits, a half of the memory capacity, can be accessed. Additionally, there is no signal corresponding to the terminals CS and CKE. When the signals CS0 and CKE0 or CS1 and CKE1 are inputted, only the area of 128 megabits can be accessed. As a result, a computer body which outputs only address signals A0 to A11 can use only a half area of the 256-megabit SDRAM.

The memory module 10, using the after-mentioned memory circuit, generates an address signal A12 (additional address signal) upper than the signals A0 to A11 and thereby permits the computer body to access a memory area which cannot be accessed using only the signals A0 to A11.

Figure 6:
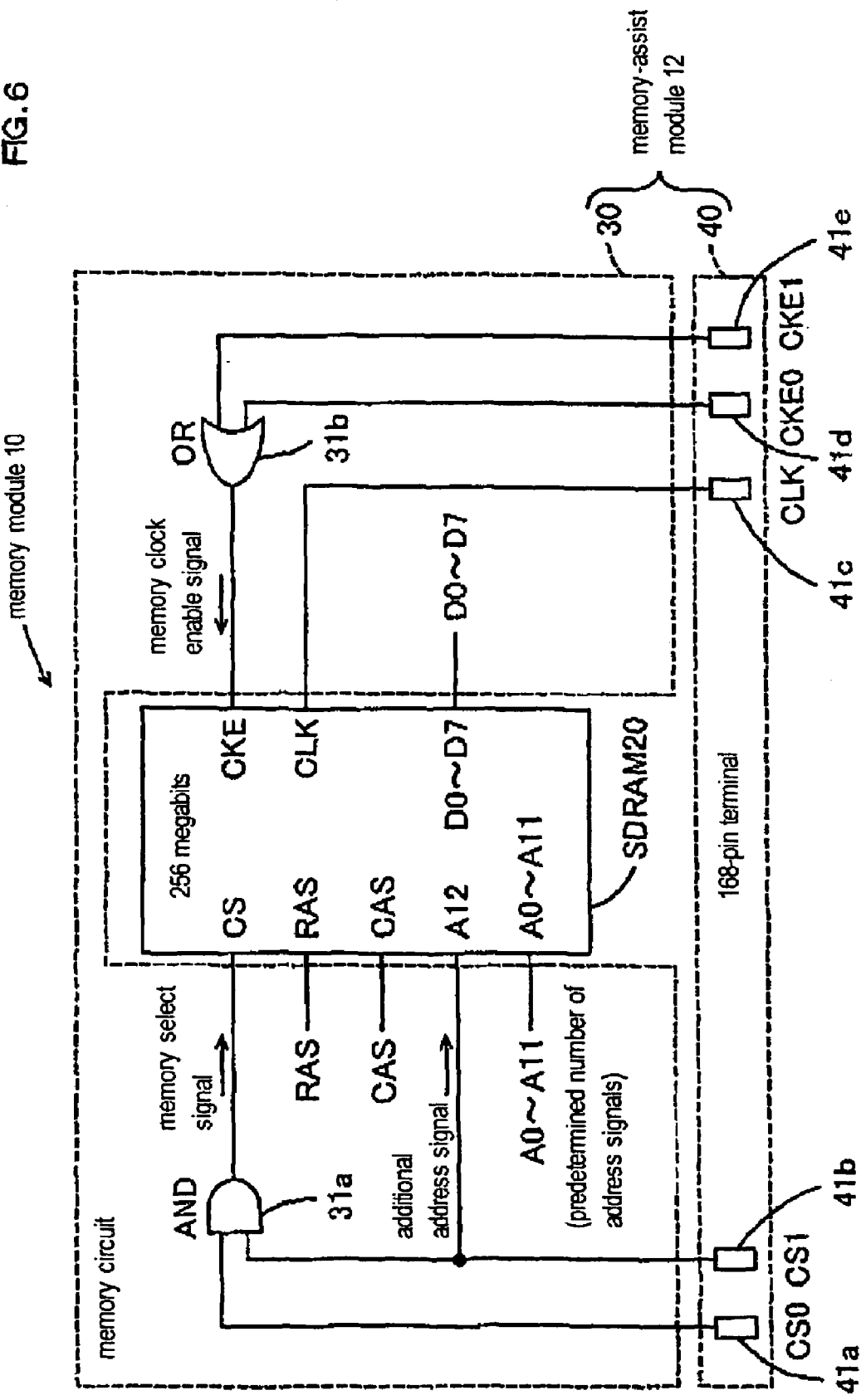
FIG. 6 is a circuit diagram showing a main part of a circuit of a memory module.

FIG. 6 is a circuit diagram showing a main part of a circuit of the memory module 10. The 256-megabit SDRAM 20 of FIG. 6 is a representative of one (for example, the leftmost SDRAM) of the eight SDRAMs shown in FIG. 1. Actually, the same circuit is formed on all of the eight SDRAMs 20. A different type of data signal lines are connected to the terminals D0 to D7 of the SDRAMs 20. The same data signal lines are connected to the other terminals. For plain explanation, only names of the signals inputted/outputted to/from the terminals RAS, CAS, A0 to A11, and D0 to D7 are described. Actually, the signal lines for these signals are connected to a 168-pin terminal 40.

In FIG. 6, a memory-assist module 12 comprises a memory circuit 30 and the terminal 40. The memory circuit 30 comprises an AND gate 31a and OR gate 31b, which are provided in a gate IC 31.

A CS0 terminal 41a and Cs1 terminal 41b in the terminal 40 are connected to two input terminals of the AND gate 31a. The CS terminal of the SDRAM 20 is connected to an output terminal of the AND gate 31a. A logical product of CS0 and CS1 signals, which are select signals for the 128-megabit SDRAM, is provided to the CS terminal of the SDRAM 20 as a memory select signal CS. In the memory module 10, when either of the inputted signals CS0 and CS1 represents L (a memory space of 128-megabit virtual memories is selected), the memory select signal CS is switched to L (a 256-megabit SDRAMS is selected), and when all of the inputted signals CS0 and CS1 represent H (a memory space of 128-megabit virtual memories is unselected), the memory select signal CS is switched to H (a 256-megabit SDRAMS is unselected). In this circuit, a plurality of select signals are inputted, and a memory select signal can be properly generated according to the inputted select signals.

Figure 7:
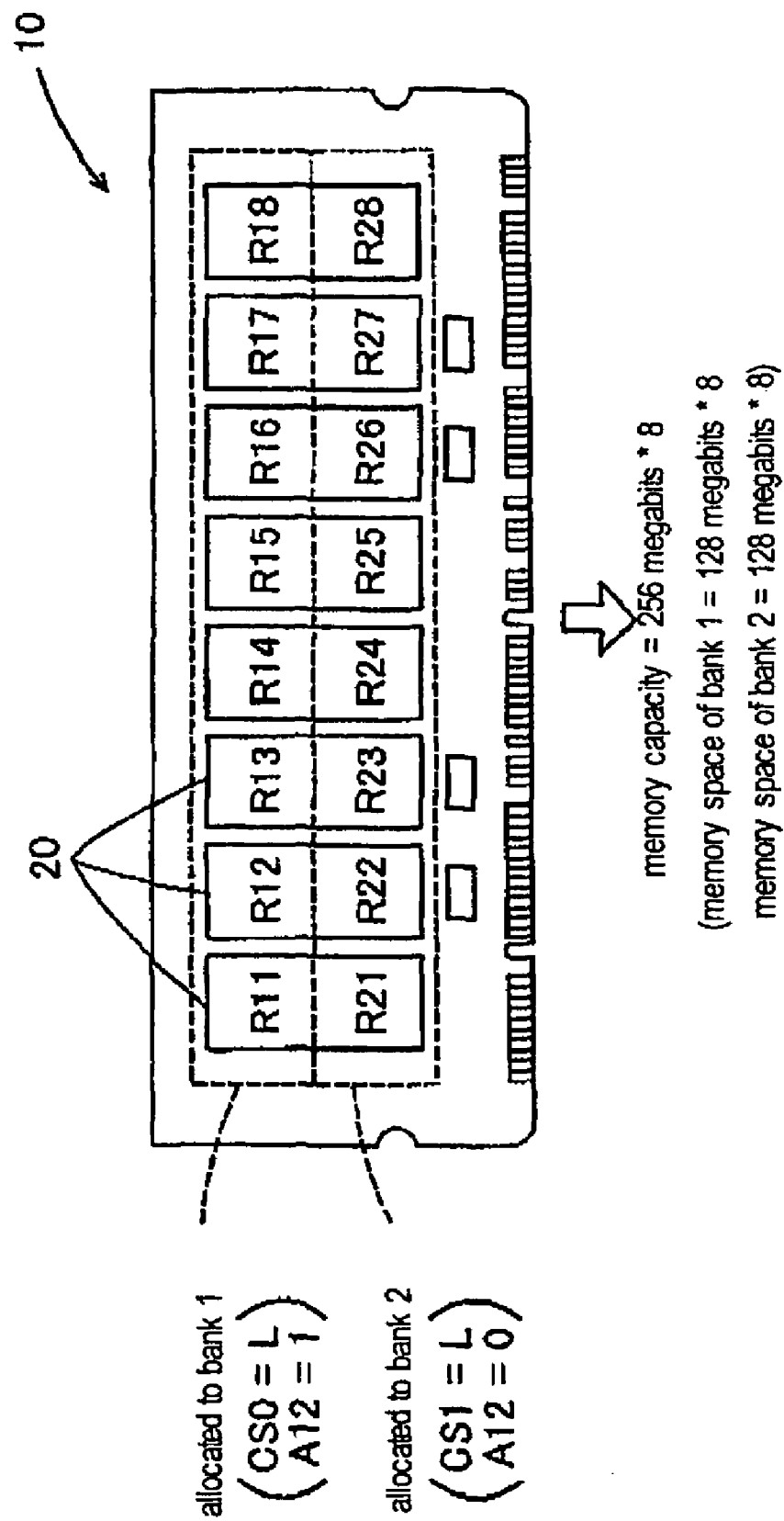
FIG. 7 typically shows memory spaces each having 128 megabits, the memory spaces being allocated on a memory area of 256 megabits.

The terminal CS1 is connected to the terminal A12 of the SDRAM 20. When the signal CS1 represents L, a signal A12 inputted from the terminal A12 becomes "0". When the signal CS0 represents L, the signal CS1 represents H, and a signal A12 inputted from the terminal A12 becomes "1". In this circuit, a plurality of select signals are inputted, and an additional address signal A12 added to a predetermined number of address signals A0 to A11 can be generated in a form of simple configuration according to the inputted select signals. The additional address signal A12 is a signal which can represent an address upper than an address represented by the signals A0 to A11. As shown in FIG. 7, a half memory area of the 256 megabit SDRAMs 20 is allocated to the bank 1 (when the signal CS0 is L), and another half memory is allocated to the bank 2 (when the signal CS1 is L). The memory areas allocated corresponding to the above-described virtual memories R11 to R18 and R21 to R28 are given the same codes. As shown in FIG. 7, for example, the virtual memory R11 allocated to the bank 1 and the virtual memory R21 allocated to the bank 2 are both provided in the same 256-megabit SDRAM 20 on the leftmost. In such a manner, according to the select signals, a memory area of the same SDRAM can be divided, and thus the memory module can be used as a memory module virtually having two banks using 128 megabit SDRAMs.

When the signal A12 is generated from two types of the select signals CS0 and CS land inputted into the terminal A12, the signal CS0, instead of the signal CS1, may be inputted into the terminal A12.

As described above, the memory circuit 30 receives a predetermined number of the address signals A0 to all and a plurality of the select signals CS0 to CS1 from the desktop type PC to generate the memory select signal CS and additional address signal A12, and provides the signal CS, the additional address signal A12, and a predetermined number of the address signals A0 to a11 to the 256 megabit SDRAMs 20. As a result, the corresponding data is accessible by the desktop type PC.

Some desktop PCs output a plurality of clock enable signals for sleeping the 128-megabit SDRAMs in the unused bank. The signal CLK and a plurality of the clock enable signal CKE0 and CKE1 are inputted from the desktop type PC to the memory circuit 30, which then generates a memory clock enable signal CKE according to the inputted signal CKE0 and CKE1 and provides the signal CKE and the signal CLK to the SDRAMs 20.

A CLK terminal 41c in the terminal 40 is connected to the CLK terminal of the SDRAM 20. Therefore, the memory circuit 30 receives the signal CLK from the desktop type PC, and provides it to the SDRAM 20.

A CKE0 terminal 41d and a CKE1 terminal 41e are connected to two input terminals of an OR gate 31b, respectively. The CKE terminal of the SDRAM 20 is connected to an output terminal of the OR gate 31b. A logical add of the CKE0 and CKE signals for the 128-megabit SDRAM is provided as a CKE signal to the CKE terminal of the 256-megabit SDRAM. In other words, in the memory module 10, when either of the inputted CKE0 and CKE1 signals represents H (a clock signal input of the memory space of the 128-megabit virtual memory is valid), the CKE signal is H (a clock signal input for the 256-megabit SDRAM is valid), and when all of the inputted CKE0 and CKE1 signals represent L (a clock signal input for the memory space of the 128-megabit virtual memory is invalid), the CKE signal is L (a clock signal input for the 256-megabit SDRAM is invalid).

(2) Effect of the Memory Module

Figure 8:
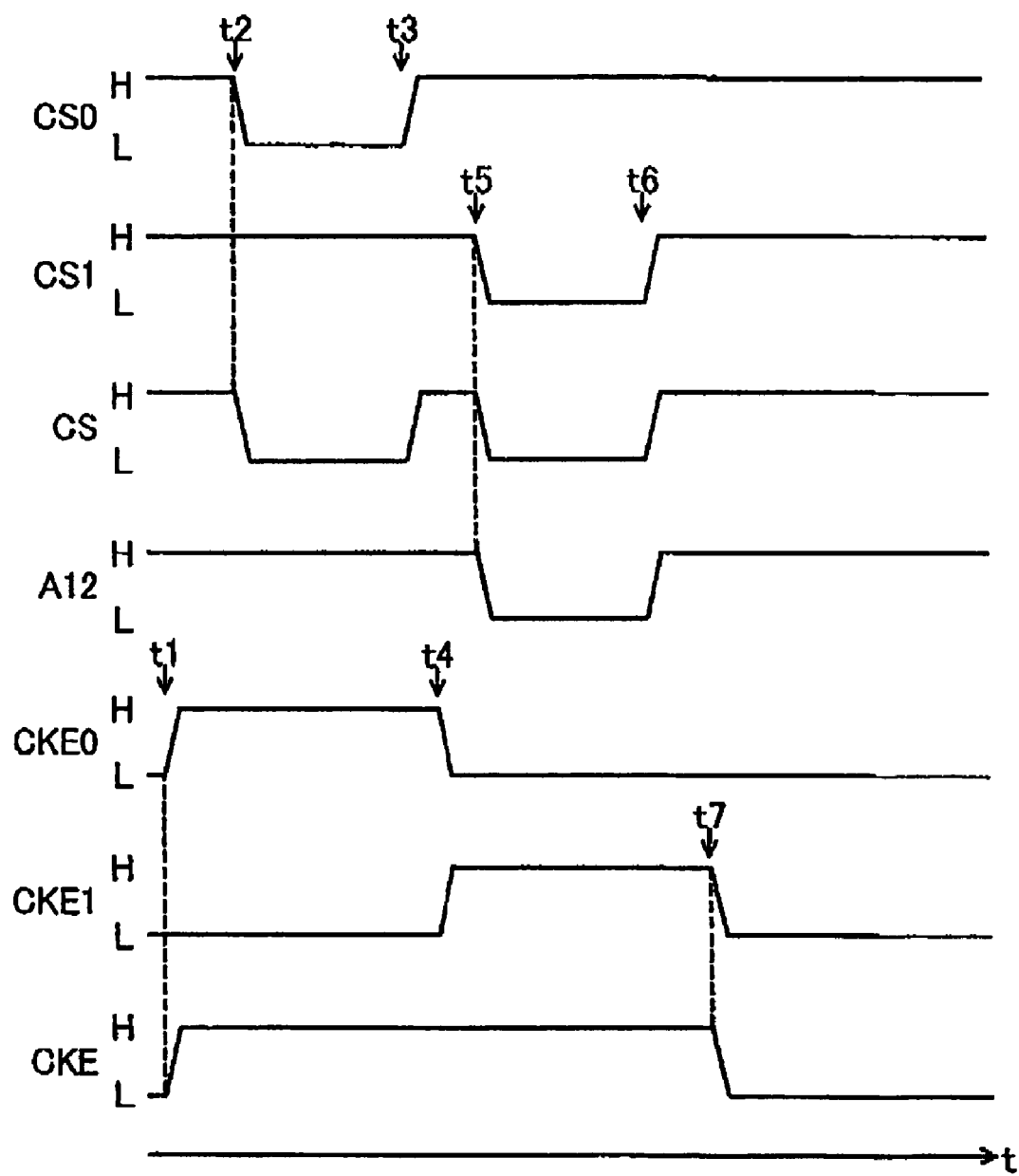
FIG. 8 is a timing chart showing states of various signals.

Next, referring to a timing chart of FIG. 8, effect of the memory module 10 is explained. Timing t1 to t7 is the same as FIG. 4.

When the signal CKE0 is switched from L to H to cancel a sleep state of the virtual memories of the bank 1, H is inputted into either of the input terminals of the OR gate 31b, the signal CKE outputted from the OR gate 31b becomes H (valid state). Even when the signal CKE0 is switched from H to L and the signal CKE1 signal is switched from L to H (timing t4) to cancel a sleep state of the virtual memories of the bank 2, H is inputted into either of the input terminals of the OR gate 31b, so that the signal CKE outputted from the OR gate 31b becomes H (valid state). On the other hand, since the CKE1 signal is switched from H to L (timing t7) to sleep the virtual memories of the banks 1 and 2, L is inputted into the input terminals of the OR gate 31b, a signal CLK outputted from the OR gate 31b becomes L (invalid state).

Only when virtual memories on the banks 1 and 2 become a sleep state, L is inputted into the CKE terminal of the 256-megabit SDRAM 20, so that an input of the signal CLK becomes invalid. On the other hand, when a sleep state of the virtual memories on either of the banks 1 and 2 is canceled, H is inputted into the CKE terminal, so that the CLK signal input becomes valid and the 256-megabit SDRAM 20 operates according to the inputted signal CLK.

As described above, when the desktop type PC outputs a plurality of clock enable signals to a memory space of a plurality of 128-megabit virtual memories, the 256-megabit SDRAMs can be properly accessed.

When the signal CKE0 is H, and the signal CS0 is switched from H to L (timing t2) to access virtual memories of bank 1, L is inputted into either of the input terminals of the AND gate 31a, so that a signal CS outputted from the AND gate 31a becomes L (selected state). In this case, because the CS1 signal is H, the A12 signal becomes H meaning 1, and thus H is inputted into the A12 terminal of the SDRAM 20.

Additionally, when the signal CKE1 is H, and the signal CS1 is switched from H to L (timing t5) to access the virtual memories of the bank 2, L is inputted into either of the input terminals of the AND gate 31a, so that a signal CS outputted from the AND gate 31a becomes L (selected state). In this case, because the signal CS1 is L, the signal A12 becomes L meaning 0, and L is inputted into the terminal A12 of the SDRAM 20.

As a result, L is inputted into the CS terminal of the 256-megabit SDRAM 20 when the desktop type PC accesses the virtual memories of the banks 1 and 2, so that the desktop type PC can access the 256-megabit SDRAM 20.

In this case, when the virtual memories of the bank 1 are accessed, the signal A12 becomes 1, and when the virtual memories of the bank 2 are accessed, the signal A12 becomes 0, so that the desktop type PC can access data of 256 megabits corresponding to the additional signal A12 and the predetermined number of the address signals A0 to A11.

In such a manner, even when a 256-megabit memory where only 128-megabit memory area is accessible using only the predetermined number of the address signals A0 to A11 is used, the address signal A12 other than the signals A0 to A11 is generated according to the select signal, enabling the computer body to access the conventionally inaccessible memory area of the 256-megabit memory thereby to permit of effective use of memory areas. More specifically, the computer body may access the memory area through the memory module virtually having two banks using 256 megabit SDRAMs and 128 megabit SDRAMs. This permits of the access from old machines even in the current condition where 256 megabit SDRAMs are mainly used in newest machines.

Additionally, by generating the memory select signal CS from the plurality of the select signals CS0 and CS1, the number of memories accessible from the computer body can be increased, so that a memory capacity the computer body can use can be expanded.

(3) Alternatives

Various alternative memory module is possible.

The memory module 10 is a DIMM having no ECC (Error Correction Code). The present invention is applicable to a memory module having ECC, because only a memory for ECC is added. The present invention may be applicable to SIMMs, in addition to DIMMs.

Some SDRAMs have sixteen data signal input/output terminals. When such a memory can receive a plurality of address signals greater than a predetermined number of address signals generated by a computer body, the present invention is applicable to the memory, so that the memory area can be effectively used. The present invention is applicable to memories other than ones having eight or sixteen data signal input/output terminals. The present invention is applicable to, e.g., ROMs, permitting only read of data.

Further, the present invention is applicable when a computer body other than one outputting a predetermined number of address signals corresponding to 128-megabit memory is used. For example, a computer body which can use a memory of up to 64 megabits can use a 128-megabit memory, and as after-mentioned, even a memory having more than 256-megabit capacity when the present invention is applied. A computer body which can use a memory of up to 256 megabits can use a memory of more than 512 megabits when the present invention is applied.

Figure 9:
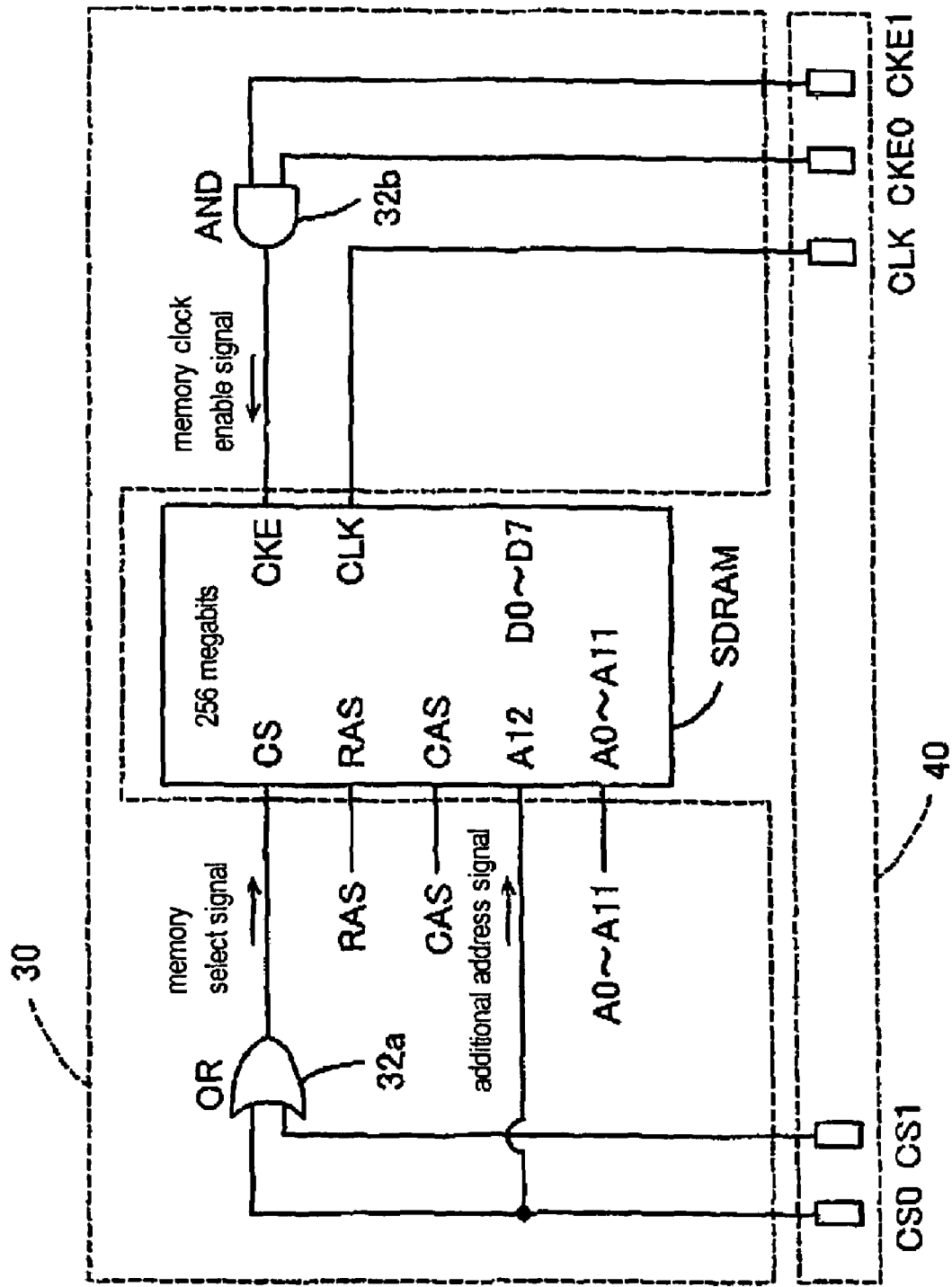
FIG. 9 is a circuit diagram showing a main part of circuit of a memory module of an alternative.

When a select signal and memory select signal are positive logic, as shown in FIG. 9, an OR gate 32a may be used instead of the AND gate 31a. As a result, when either of signals CS0 and CS1 represents H (selected state), a memory select signal CS becomes H (selected state), so that the SDRAM becomes accessible.

When a clock enable signal and memory clock enable signal are negative logic, as shown in FIG. 9, an AND gate 32b may be used instead of the OR gate 31b. As a result, when either of signals CKE0 and CKE 1 represents L (valid state), a signal CKE becomes L (valid state), so that the SDRAM becomes operable according to the signal CLK.

Further, without providing a memory select signal to memories mounted on the memory module of the present invention, the memory module is operable. When a computer body generates two types of select signals for two memory spaces corresponding to a predetermined number of address signals, CS terminals of the mounted memories may be always selected without generating a memory select signal. In the memory, data corresponding to a plurality of address signals greater than a predetermined number of address signals may be accessible. In this case, no CS terminal may be provided.

In this case, the memory circuit may receive a predetermined number of address signals and a select signal, generate an additional address signal added to the predetermined number of the address signals according to the inputted select signal, and provide to the memory the additional address signal and the inputted predetermined number of the address signals, so that the computer body can access the corresponding data. In this example, by providing to the memory either of two types of select signal inputted from the computer body as an additional address signal, a memory area of the same memory can be divided according to the select signals, and thus the memory area can be effectively used.

Figure 10:
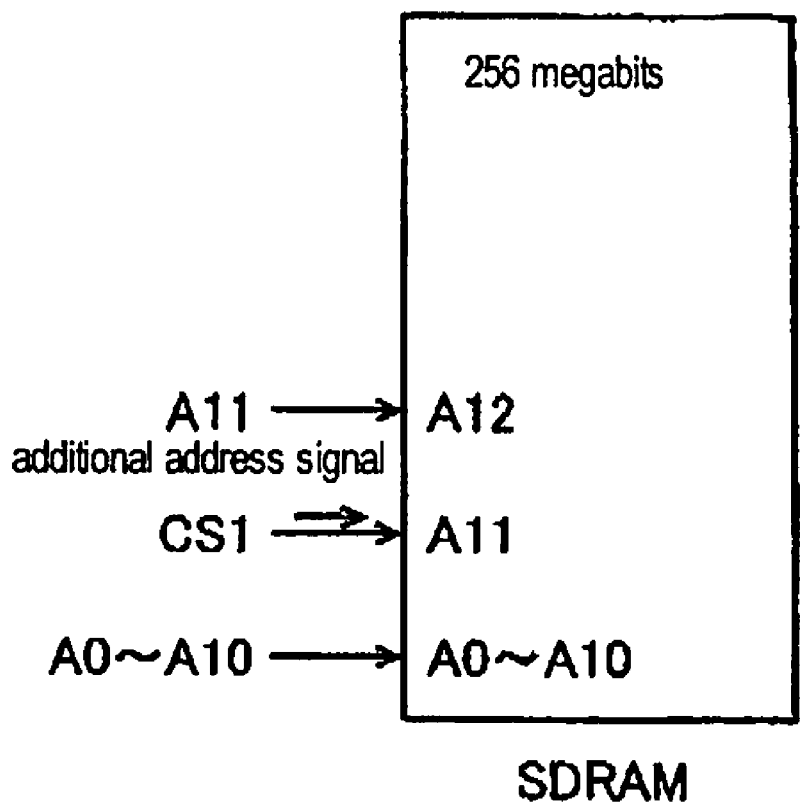
FIG. 10 is a block diagram of a main part of signals inputted into a SDRAM mounted on a memory module of another alternative.

The additional address signal may be other than an address signal representing the most significant address which can be inputted into a memory. FIG. 10 is a block diagram showing a main part of signals inputted into a 256-megabit SDRAM mounted on a memory module of another alternative example. When terminals A11 and A12 are used for input of not a column address but only a row address, signals A0 to A10 may be inputted from a terminal into terminals A0 to A10 of a 256-megabit SDRAM, a signal A11 may be inputted into the terminal A12 of the 256-megabit SDRAM, and a signal CS1 may be inputted as an additional address signal into a terminal A11. In a SDRAM where terminals A10 to A12 are used for only input of a row address, signals A0 to A9 from a 168-pin terminal may be inputted into terminals A0 to A9 of the SDRAM, signals A10 and A11 may be inputted into terminals A11 and A12 of the SDRAM, and a signal CS1 may be inputted as an additional address signal into a terminal A10. When a terminal A0 is used for only input of a row address, the signal CS1 from a 168-pin terminal may be inputted as an additional signal into a terminal A0.

Figure 11:
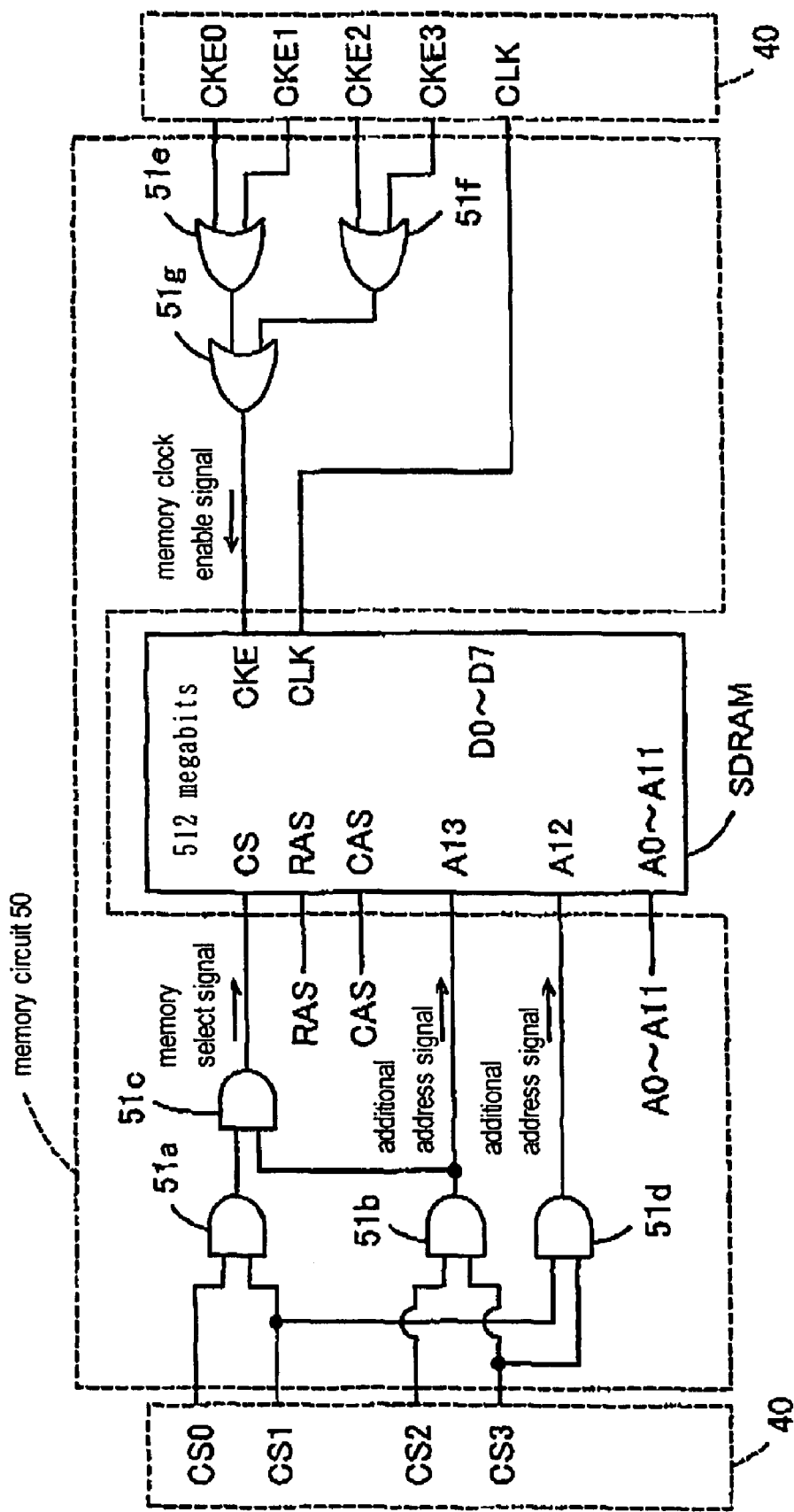
FIG. 11 is a circuit diagram showing a main part of a circuit of a memory module of another alternative.

A plurality of additional addresses may be generated from more than three types of select signals for selecting more than three banks. FIG. 11 is a circuit diagram showing a main part of a memory module of another alternative example.

The memory module is a 512-megabyte DIMM having eight 512-megabit SDRAMs. The SDRAM can receive fourteen types of address signals A0 to A13, greater by two types than a predetermined number of address signals inputted from a desktop type PC. To access the whole area of the SDRAM, further two types of address signals are required. The 512-megabit SDRAM of FIG. 11 is representative of the eight 512-megabit SDRAMs.

The following explanation uses a desktop type PC which uses a memory capacity of 512 megabytes as four banks each having 128 megabytes.

In FIG. 11, a memory circuit 50 comprises AND gates 51a to 51b and OR gates 51e to 51g.

Terminals CS0 and CS1 in a 168-pin terminal 40 are connected to two input terminals of the AND gate 51a. Terminals CS2 and CS3 in the 168-pin terminal 40 are connected to two input terminals of the AND gate 51b. Output terminals of the AND gates 51a and 51b are connected to two input terminals of the AND gate 51c. A terminal CS of the SDRAM is connected to an output terminal of the AND gate 51c. The memory module switches a memory select signal CS to L (a 512-megabit SDRAM is selected) when any one of a plurality of inputted select signals CS0 to CS3 is L (a memory space of a 128-megabit virtual memory is selected), and switches a memory select signal CS to H (a 512-megabit SDRAM is unselected) when all of the inputted select signals CS0 to CS3 are H (a memory space of a 128-megabit virtual memory is unselected).

An output terminal of the AND gate 51b is connected to a terminal A13 of the SDRAM. The terminal CS1 and CS3 in the terminal 40 are connected to two input terminals of the AND gate 51d. An output terminal of the AND gate 51c is connected to a terminal A12 of the SDRAM.

In other words, as shown in FIG. 12, when the signals CS0 to CS3 are 0, 1, 1, and 1, the signals A13 and A12 are 1 and 1. When the signals CS0 to CS3 are 1, 0, 1, and 1, the signals A13 and A12 are 1 and 0. When the signals CS0 to CS3 are 1, 1, 0, and 1, the signals A13 and A12 are 0 and 1. When the signals CS0 to CS3 are 1, 1, 1, and 0, the signals A13 and A12 are 0 and 0. As just described, when the signal CS representing L changes, the combination of the signals A13 and A12 changes. Thus, the circuit receives a plurality of select signals, and generates additional address signals A12 and A13 added to a plurality of address signals A0 to A11 according to the inputted select signals. As a result, ¼ of a memory area of the 512-megabit SDRAM 20 is allocated to each of the banks 1 to 4 when all the signals CS0 to CS3 is L.

When the signal A13 is generated and inputted into the terminal A13, a logic product of the signals CS0 and CS1 may be inputted instead of a logic product of the signals CS2 and CS3. When the signal A12 is generated and inputted into the terminal A12, a logic product of the signals CS0 and CS2 may be inputted instead of a logic product of the signals CS1 and CS3.

The memory circuit 50 receives a predetermined number of address signals A0 to A11 and a plurality of select signals CS0 to CS3 from the desktop type PC, generates a memory select signal CS and additional address signals A12 and A13, and provides the signals CS, the additional address signals A12 and A13, and the predetermined number of the address signals A0 to A11 to the 512-megabit SDRAM. As a result, the desktop type PC can access the corresponding data of the whole memory area.

The terminal CKE0 and CKE1 in the terminal 40 are connected to two input terminals of the OR gate 51e. The terminal CKE2 and CKE3 in the terminal 40 are connected to two input terminals of the OR gate 51f. Output terminals of the OR gate 51e and 51f are connected to two input terminals the OR gate 51g. The terminal CKE of the SDRAM is connected to an output terminal of the OR gate 51g. The memory module switches a memory clock enable signal to H (a clock signal input of a 512-megabit SDRAM is valid) when any one of a plurality of the inputted clock enable signals CKE0 to CKE3 is H (a clock signal input for a memory space of 128-megabit virtual memories is valid), and switches a memory clock enable signal to L (a clock signal input of a 512-megabit SDRAM is invalid) when all of a plurality of the inputted clock enable signals CKE0 to CKE3 is L (a clock signal input for a memory space of 128-megabit virtual memories is invalid). Accordingly, when the desktop type PC outputs a plurality of clock enable signals to a memory space of a plurality of 128-megabit virtual memories, the 512-megabit SDRAM is properly accessible.

When the computer body uses three banks each having 128 megabytes, the signals CS3 and CKE3 are not inputted into the memory module. However, the computer body can use a memory area of 384 megabits (128 megabits*3) in the 512-megabit SDRAM by using the circuit of FIG. 11. In this case, the memory area of the 512-megabit SDRAM is partially used. The computer body can use a memory area of over 128 megabits which is accessible using only a predetermined number of address signals A0 to A11, so that the memory area of the 512-megabit SDRAM can be effectively used.

When a memory module having 1-gigabit SDRAMs which can receive signals A0 to A14 is used, and the computer body can generate a predetermined number of address signals A0 to A11 and eight types of select signals CS0 to CS7, the present invention is applicable. In this case, the memory circuit receives the signals A0 to A11 and signals CS0 to CS7, generates a memory select signal CS and additional address signals A12 to A14, and provides the signal CS, additional address signals A12 to A14, and the signals A0 to A11 to the 1-gigabit SDRAM, so that the desktop type PC can access the corresponding data of the whole memory area. Additionally, by inputting eight types of clock enable signals CKE0 to CKE7, a memory clock enable signal CKE can be generated.

Further, by mounting a memory on a memory module having no memory, the computer body can access a memory area inaccessible using only a predetermined number of address signals. Thus, as shown in FIG. 6, the present invention is effective to the memory-assist module 12 which is the memory module 10 not having the SDRAMs 20. The memory-assist module may have a memory socket, or a shape to which a memory can be soldered.

As described above, according to the present invention, using various modes, even when a memory the whole area of which is not accessible using only a predetermined number of address signals inputted from a computer body is used, the computer body can access the memory area which is not accessible using only the predetermined number of the address signals. As a result, a memory module and memory-assist memory module effectively using memory areas can be provided.

We claim:

1. A memory module standardized and connectable to a computer body generating a predetermined number of address signals, a plurality of select signals representing a select or unselected state of each of memory spaces having a capacity corresponding to the predetermined number of the address signals, a pulse-shaped clock signal, and a plurality of clock enable signals representing a valid or invalid state of an input of the clock signal for each of the plurality of the memory spaces, the memory module comprising:

a memory receiving a memory select signal representing a select or unselected state and a plurality of address signals greater than the predetermined number of the address signals, and permitting data corresponding the plurality of the address signals to be accessible when the memory select signal represents a selected state;

the memory receiving the clock signal and a memory clock enable signal representing a valid or invalid state of an input of the clock signal, and operating according to the clock signal when the clock enable signal is valid;

a memory circuit receiving the predetermined number of the address signals and a plurality of select signals from the computer body, generating the memory select signal and an additional address signal added to the predetermined number of the address signals according to the inputted select signals, and providing the generated memory select signal, the generated additional address signal, and the predetermined number of the inputted address signals to the memory to permit the computer body to access data corresponding thereto; and the memory circuit receiving the clock signal and the plurality of the clock enable signals, generating the memory clock enable signal according to the plurality of the inputted clock enable signals, and providing the memory clock enable signal and the inputted clock signal to the memory.

2. The memory module of claim 1, wherein the memory circuit makes the memory select signal represent a selected state of the memory when any of the plurality of the inputted select signals represents a selected state of a memory space, and makes the memory select signal represent an unselected state of the memory when all the plurality of the inputted select signals represent an unselected state of the memory space.

3. The memory module of claim 1, wherein the computer body generates two types of select signals representing a selected or unselected state of two memory spaces of a capacity corresponding to the predetermined number of the address signals, and wherein the memory circuit receives either of the two types of the select signals from the computer body, and provides the either of the select signals as the additional address to the memory.

4. The memory module of claim 1, wherein the memory circuit makes the memory clock enable signal represent a valid state of a clock signal input of the memory when any one of the inputted plurality of the clock enable signals represent a valid state of a clock signal input of the memory, and makes the memory clock enable signal represent an invalid state of a clock signal input of the memory space when all the inputted plurality of the clock enable signals represent an invalid state of a clock signal input of the memory space.

5. The memory module of claim 1, wherein the additional address signal represents an address upper than one represented by the predetermined number of the address signals.

6. A memory module standardized and connectable to a computer body generating a predetermined number of address signals, a select signal representing a selected or unselected state of each of a plurality of memory spaces having a capacity corresponding to the predetermined number of the address signals, a pulse-shaped clock signal, and a plurality of clock enable signals representing a valid or invalid state of an input of the clock signal for each of the plurality of the memory spaces, the memory module comprising:

a memory receiving a plurality of address signals greater than the predetermined number of the address signals and permitting data corresponding thereto to be accessible;

the memory receiving the clock signal and a memory clock enable signal representing a valid or invalid state of an input of the clock signal, and operating according to the clock signal when the clock enable signal is valid;

a memory circuit receiving the predetermined number of the address signals and a select signal, generating an additional address added to the predetermined number of the address signals according to the inputted select signal, and, by providing the additional address signal and the predetermined number of the inputted address signals to the memory, permitting data corresponding thereto to be accessible by the computer body; and the memory circuit receiving the clock signal and the plurality of the clock enable signals, generating the memory clock enable signal according to the plurality of the inputted clock enable signals, and providing the memory clock enable signal and the inputted clock signal to the memory.

7. A memory-assist module wherein when a memory connected to a computer body receives a pulse-shaped clock signal, a memory clock enable signal representing a valid or invalid state of an input of the clock signal, a memory select signal representing a select or unselected states, and a plurality of address signals greater than a predetermined number of address signals, operates according to the clock signal when the clock enable signal is valid, and permits data corresponding to the plurality of the address signals to be accessible by the computer body when the memory select signal represents a selected state, the computer body generating the predetermined number of the address signals, and a plurality of select signals representing a select or unselected state of each of a plurality of memory spaces having a capacity corresponding to the predetermined number of the address signals, the clock signal, and a plurality of clock enable signals representing a valid or invalid state of an input of the clock signal for each of the plurality of the memory spaces, the clock signal, the plurality of the clock enable signals, the predetermined number of the address signals, and the plurality of the select signals are inputted from the computer body, the memory clock enable signal is generated according to the plurality of the inputted clock enable signals, the memory clock enable signal and the inputted clock signal are provided to the memory, the memory select signal and an additional address signal added to the predetermined number of the address signals are generated according to the inputted select signals, and the generated memory select signal, the generated additional address signal, and the predetermined number of the inputted address signals are provided to the memory.

8. A memory-assist module wherein when a memory connected to a computer body receives a pulse-shaped clock signal, a memory clock enable signal representing a valid or invalid state of an input of the clock signal, a plurality of address signals greater than a predetermined number of address signals, operates according to the clock signal when the clock enable signal is valid, and permits the corresponding data to be accessible by the computer body, the computer body generating the predetermined number of the address signals, a select signal representing a select or unselected state of each of a plurality of memory spaces having a capacity corresponding to the predetermined number of the address signals, the clock signal, and a plurality of clock enable signals representing a valid or invalid state of an input of the clock signal for each of the plurality of the memory spaces, the clock signal, the plurality of the clock enable signals, the predetermined number of the address signals, and a select signal are inputted from the computer body, the memory clock enable signal is generated according to the plurality of the inputted clock enable signals, the memory clock enable signal and the inputted clock signal are provided to the memory, an additional address signal added to the predetermined number of the address signals is generated according to the inputted select signal, and the additional address signal and the inputted predetermined number of the address signals are provided to the memory.

* * * * *